United States Patent [19]
Hoerner et al.

[11] Patent Number: 5,751,134
[45] Date of Patent: May 12, 1998

[54] GAS GAUGING SYSTEM AND METHOD FOR MONITORING BATTERY CAPACITY FOR BATTERY POWERED ELECTRONIC DEVICES

[75] Inventors: Brian Hoerner; Kam Quan; Frank Smith, all of Spokane, Wash.

[73] Assignee: Itronix Corporation, Spokane, Wash.

[21] Appl. No.: 649,316

[22] Filed: May 16, 1996

[51] Int. Cl.$^6$ .................. H01M 10/44; H01M 10/46; H01M 10/48

[52] U.S. Cl. .................................. 320/21; 320/43

[58] Field of Search .................. 320/5, 14, 21, 320/30, 31, 32, 35, 39, 43, 48, 22

[56] References Cited

U.S. PATENT DOCUMENTS

| | | | |
|---|---|---|---|
| 5,315,228 | 5/1994 | Hess et al. | 320/31 |
| 5,371,456 | 12/1994 | Brainard | 320/31 |
| 5,459,671 | 10/1995 | Duley | 320/43 X |
| 5,508,599 | 4/1996 | Koenck | 320/43 X |
| 5,541,490 | 7/1996 | Sengupta et al. | 320/14 |
| 5,565,759 | 10/1996 | Dunstan | 320/48 |
| 5,572,110 | 11/1996 | Dunstan | 320/35 X |

OTHER PUBLICATIONS

"Laptop Batteries: The Charge of the Light Brigade", Computer Shopper Magazine, May 1996, p. 302.
Generic Notebook Computer User's Manual provided with a Midwest Micro Sound Book II Laptop Computer, 1996.

*Primary Examiner*—Edward Tso
*Attorney, Agent, or Firm*—Wells, St. John, Roberts, Gregory & Matkin, P.S.

[57] ABSTRACT

A battery management system in the form of a gas gauging system is disclosed for enhancing the monitoring of battery power supply. The battery management system includes a battery powered device and a battery selectively connected to the device for supplying operating power to the device. The system also includes an auxiliary power supply configured for connection with the battery for supplying charging power to the battery. A processor is carried by the device and is configured to enable the battery and the power supply, respectively, for powering the device. The processor is further configurable during connection of the auxiliary power supply to completely discharge the battery from a fully charged state to a fully discharged state via a discharge cycle. The system also includes a detector that is configurable to measure battery capacity during the discharge cycle of the battery. Finally, the system includes an output device for outputting a value based upon the measured battery capacity. Additionally, a method of monitoring battery discharge of a battery powered device is disclosed.

30 Claims, 9 Drawing Sheets

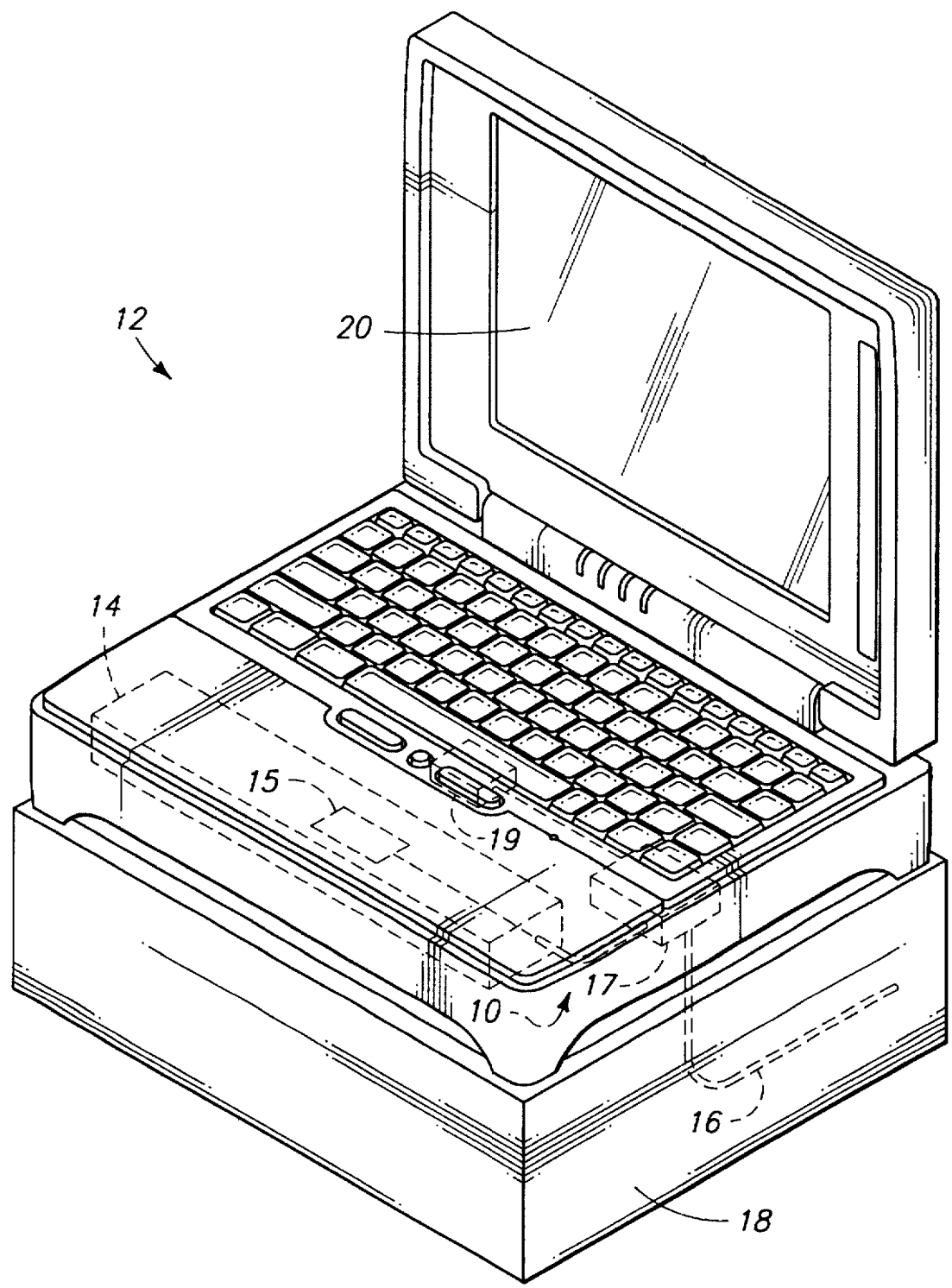

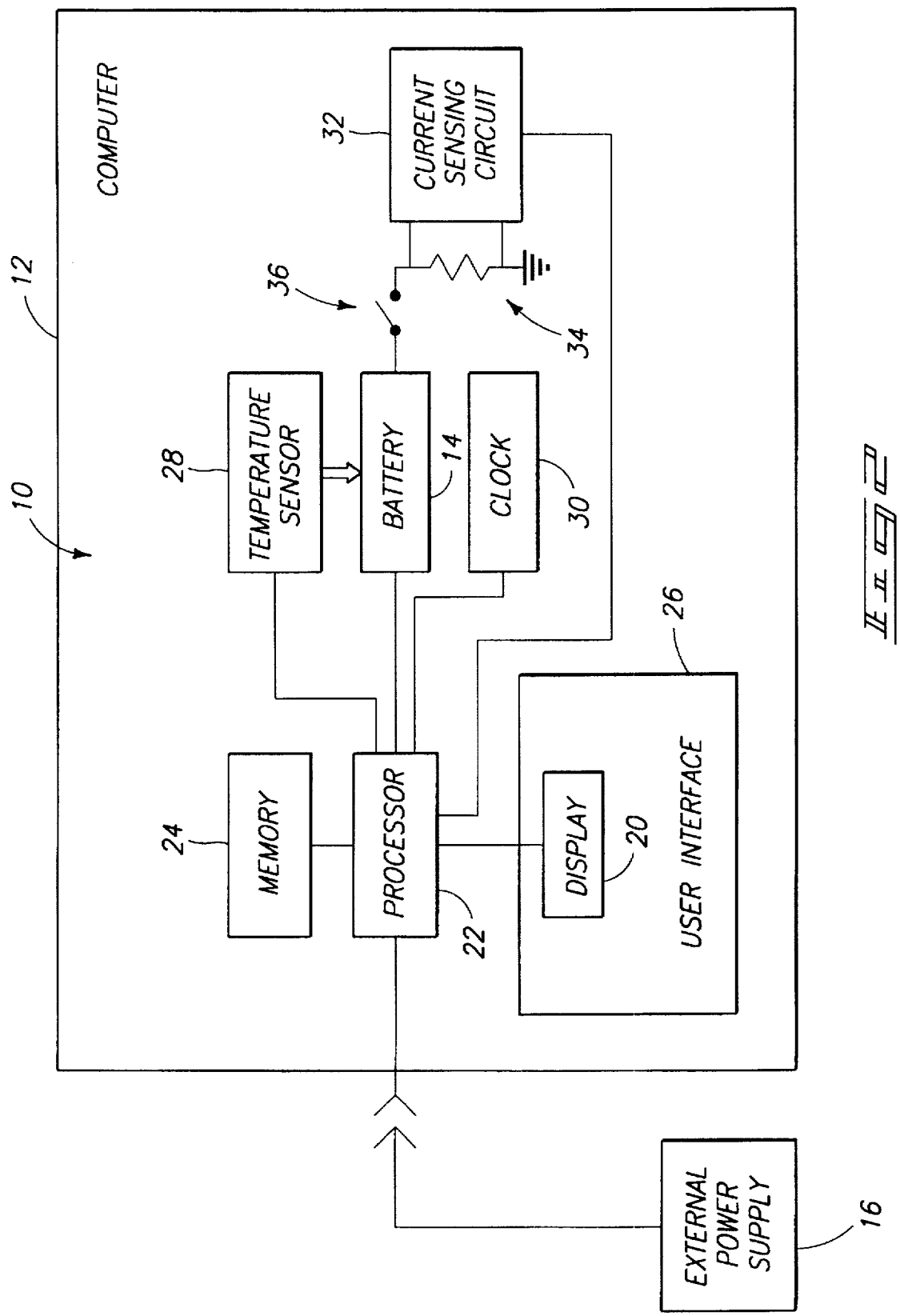

38

| Battery Maintenance |
|---|

File  View  Maintenance  Help

Deep Cycle Discharge

Last deep cycle timestamp    Tues May 07 18:56 1996

Deep cycle process information

| Measured capacity programmed | | Start Deep Cycle |
|---|---|---|
| Fast charge started Tues May 07 18:56 1996 | | Cancel Deep Cycle |
| Deep cycle finished: Tues May 07 22:23 1996 | | |

Current charge state:   Maintenance charge
Battery current (mA):   2
Gas gauge (%):   100
Battery temperature:   82°F      40
Estimated time to completion:   Done

FIG. 3

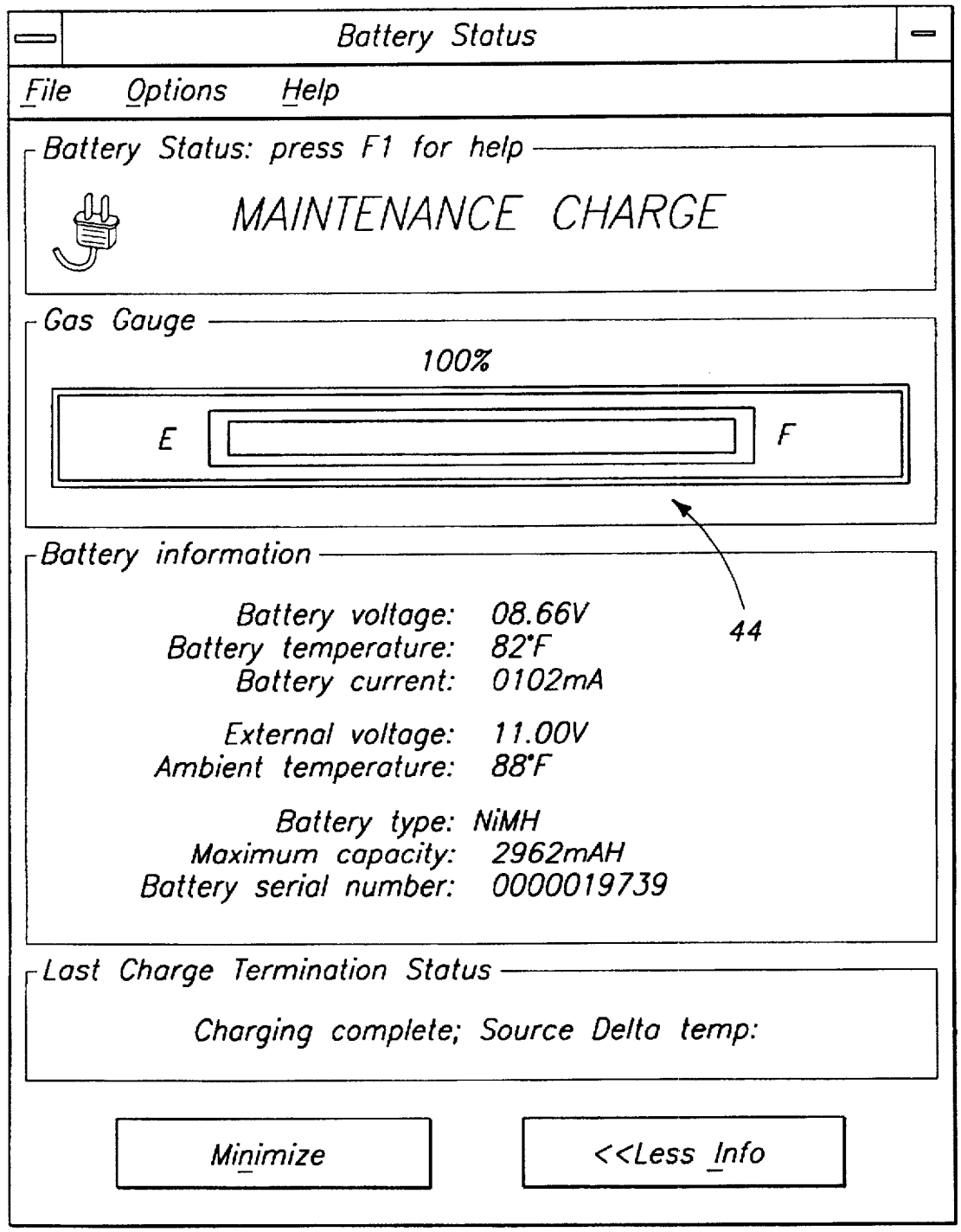

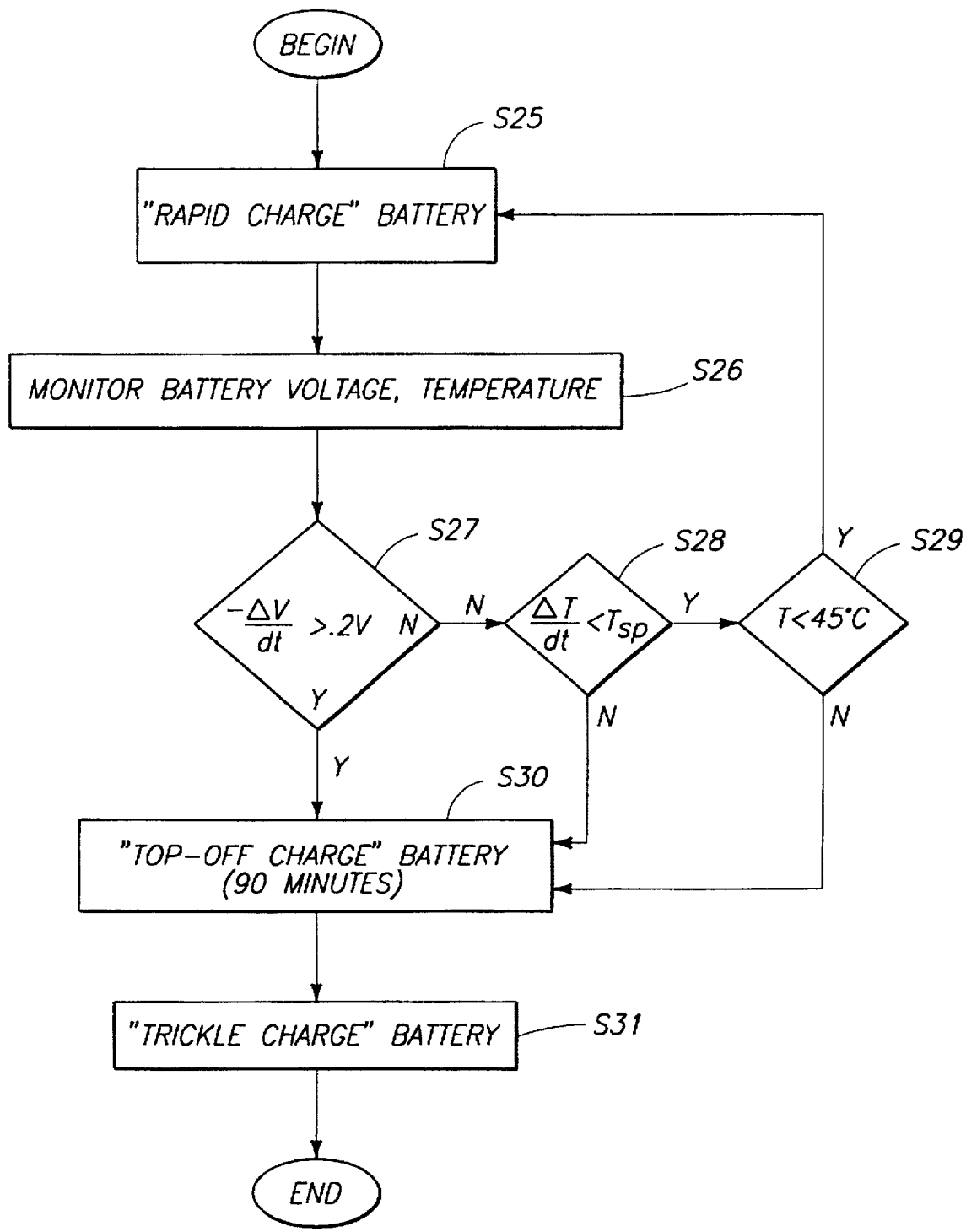

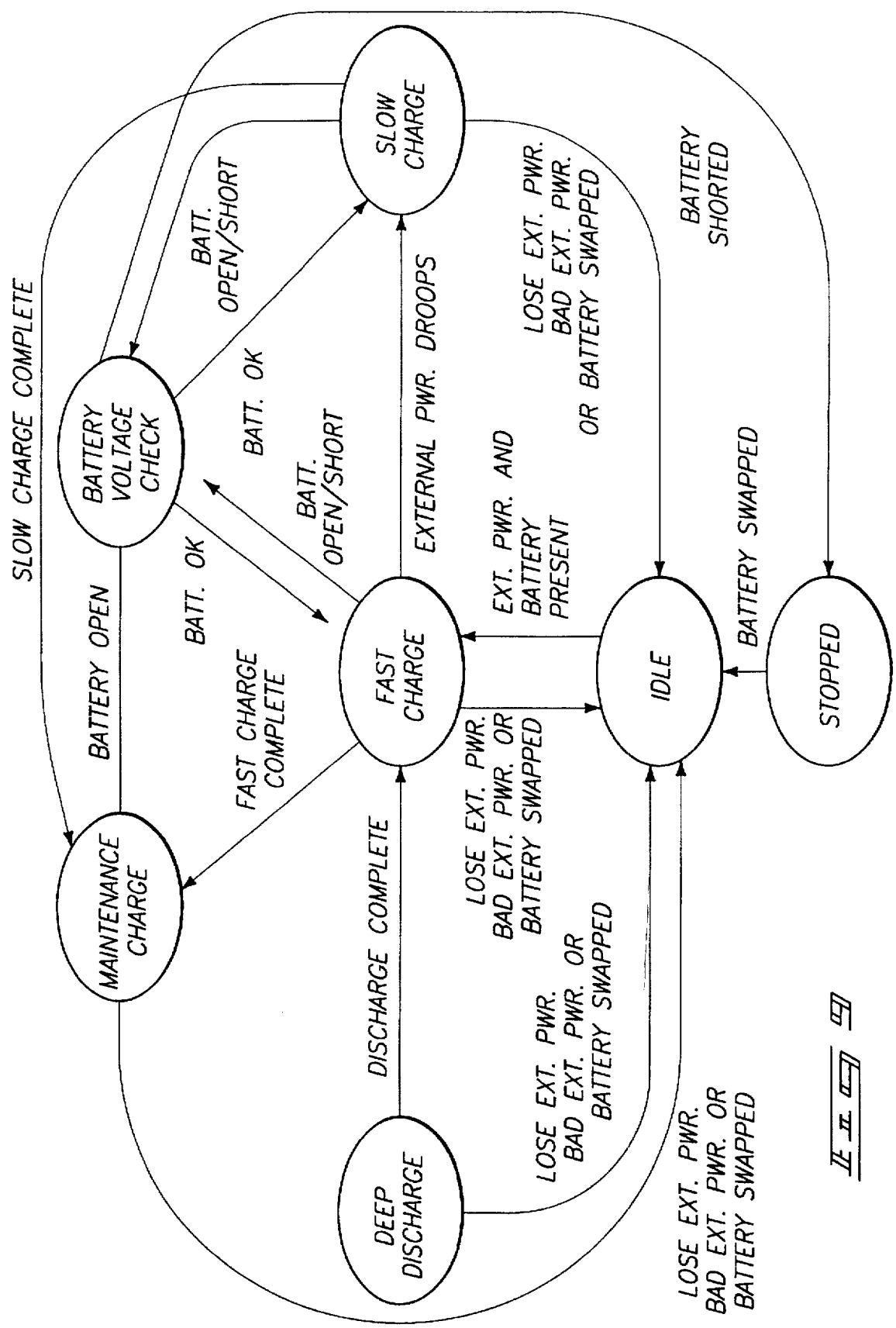

GAS GAUGING SYSTEM AND METHOD FOR MONITORING BATTERY CAPACITY FOR BATTERY POWERED ELECTRONIC DEVICES

TECHNICAL FIELD

This invention relates to battery powered devices, and more particularly to battery management systems, such as gas gauging systems, and methods for monitoring the capacity of a battery while in use on such a device.

BACKGROUND OF THE INVENTION

Over the years, battery charging systems have become more sophisticated. The advances in systems have come as a result of the desire to extend the life of the battery by avoiding damage to the battery during charging. Damage to a NiCad battery can occur if the charging current is too high, or the temperature rises too high. Furthermore, NiCad batteries are plagued with a memory effect, wherein a battery that is repeatedly drained over a range less than from a fully charged battery to a fully drained battery, loses it's capability to store a full charge. The memory effect found in NiCad batteries results from performing repeated charging cycles without draining the charge completely.

Inexpensive charging systems typically trickle charge a battery whenever A/C power is connected. The trickle charge rate is low enough not to overheat and damage the battery even if the battery is fully charged. Typically, the operator is advised to periodically use the device until the battery is completely drained to correct any memory effect. For example, when using battery powered tools it is frequently advised that a user completely drain the tool before connecting it with a charger. However, having to use a device until it runs out of power can be annoying at best. At worst, it can leave a user stranded without any other means of supplying power to the device, especially during remote use.

More sophisticated systems provide a rapid charge state as well as a trickle charge state. The rapid charge state obviously provides a faster charge by supplying more current to the charging cells. However, the higher current can damage the battery if it is over charged. Therefore, rapid charging systems monitor the voltage of the battery or the temperature of the battery in order to determine when the battery is charged. Typical monitoring systems actually only detect a charge of about 90% of full capacity. Thereafter, the charging system reduces the charge to the trickle charge level. However, these sophisticated charging systems recommend that the operator periodically operate the battery powered device until the battery is completely drained. For example, operating manuals for notebook computers typically caution the user to always use external, or AC power, else the user is instructed to completely drain the battery before recharging. Even further, a user is told to fully discharge and charge the battery every several weeks. However, the user is required to turn on the computer and leave it running on battery power until it is fully drained, then plug it into the external power supply to fully charge the device. Often, this leads to a user fully discharging the battery, then forgetting to plug it into the external power supply to charge the battery, rendering the device unusable the next time it is needed.

It is also known in the art to provide "gas gauging" of batteries, with gauges that supply the user with an indication of how much of the battery capacity remains available for use. Many systems are programmed to assume that battery charge capacity when full is equal to the rated capacity of the battery pack and, while current is being consumed, the remaining capacity is calculated. The problem associated with such systems is that the actual capacity and the rated capacity typically are not the same. As a battery gets older, its actual capacity drops quickly due to the memory effects. Hence, users are frequently surprised by a sudden loss of battery capacity when the "gas gauge" indicates a remaining supply of capacity still available for use.

More sophisticated systems will measure the amount of current used by the device and, if there have been no charging interruptions between when the battery was fully charged and when the operator has used the device until the battery is fully discharged, the system will use the measured capacity for gas gauging purposes. The problem associated with such a system is that, if the user never operates the device from full charge (which, as discussed earlier, may only be 90% charge) to full drain, the capacity for gas gauge purposes is never updated. Hence, this system also has the aforementioned problems associated with having to manually fully discharge and charge the battery every several weeks.

What is needed is an improved battery management system which is less susceptible to human interaction and provides more accurate "gas gauging." Furthermore, needs remain for apparatus and methods to better facilitate user detection of actual battery capacity when using battery powered devices.

BRIEF DESCRIPTION OF THE DRAWINGS

Preferred embodiments of the invention are described below with reference to the following accompanying drawings.

FIG. 1 is a schematic perspective view of a notebook computer with a battery management system embodying this invention loaded onto a docking station;

FIG. 2 is a conceptual block diagram of the notebook computer of FIG. 1 depicting layout of the battery management system;

FIG. 3 is a "Battery Maintenance" screen display illustrating one format for outputting measured battery capacity;

FIG. 4 is a "Battery Status" screen display illustrating another format for outputting measured battery capacity;

FIG. 8 is a flowchart illustrating in further detail the sequence of steps employed in rapid charging the battery during the second pass charge of FIG. 5; and FIG. 9 illustrates a charge control state diagram for the device of FIGS. 1–8 depicting the various charge states and the relational actions and events occurring therebetween.

DETAILED DESCRIPTION OF THE PREFERRED EMBODIMENTS

Figure 5:
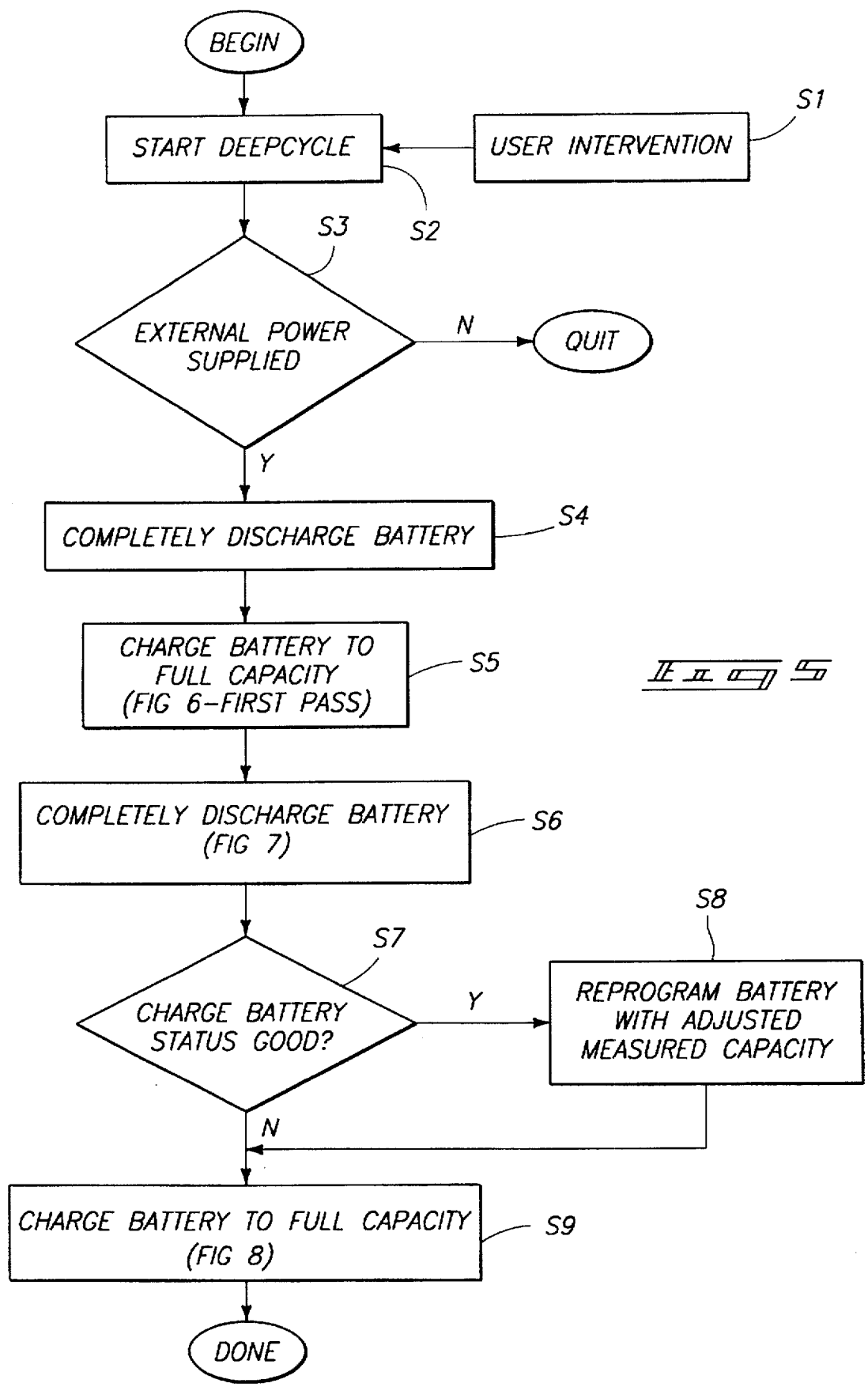
FIG. 5 is a flowchart illustrating the sequence of steps employed in detecting adjusted measured battery capacity in one embodiment of the present invention.

This disclosure of the invention is submitted in furtherance of the constitutional purposes of the U.S. Patent Laws "to promote the progress of science and useful arts" (Article 1, Section 8).

According to one aspect of this invention, a battery management system in the form of a gas gauging system is disclosed for enhancing the monitoring of battery power supply. The gas gauging system includes a battery powered device and a battery selectively connected to the device for supplying operating power to the device. The system also includes an auxiliary power supply configured for connection with the battery for supplying charging power to the battery. A processor is carried by the device and configured to operatively enable the battery and the power supply, respectively, for powering the device. The processor is further configurable during connection of the auxiliary power supply to completely discharge the battery from a fully charged state to a fully discharged state via a discharge cycle. The system also includes a detector that is configurable to measure battery capacity during the discharge cycle of the battery. Finally, the system includes an output device for outputting a value based upon the measured battery capacity.

According to another aspect of this invention, a method of monitoring battery discharge of a battery powered device is disclosed. The method comprises the steps of providing a battery powered device having a battery and an auxiliary power supply, providing the auxiliary power supply connected with the battery, completely charging the battery with the auxiliary power supply, completely discharging the battery via a discharge cycle, measuring the battery capacity during the discharge cycle of the battery, and outputting a value based upon the measured battery capacity for detection by a user of the device.

A. Overview

A preferred embodiment battery management system and method in accordance with this invention is first described with reference to FIGS. 1–9. Such show various aspects and characteristics described further below of a battery powered device incorporating a preferred battery management (or gas gauging) system and method of this invention. The battery management system is designated in FIGS. 1–9 generally with numeral 10. System 10 is implemented on a battery powered device, such as a notebook computer 12 to provide a gas gauging system for monitoring available battery power. A battery 14 is carried within computer 12 for supplying power to the computer 12 when it is separated from an auxiliary power supply. One such external power supply is an auxiliary AC power supply 16 provided within a docking cradle 18 on which computer 12 is received. AC power supply 16 supplies power separately to both a microcontroller 17 and a central processing unit (CPU) 19 via an electrical connector (not shown) that couples between cradle 18 and computer 12. A battery identification chip 15 is provided on the battery. The chip is pre-programmed with battery type, a charge algorithm and the maximum capacity of the battery in a nonvolatile memory of the chip. This information is used to initialize the battery management system 10 every time a new battery is inserted into device 12. Supply 16 produces a DC operating power source for the device. In use, battery management system 10 conveys information about measured battery capacity to a user via an output device such as display screen 20 of computer 12.

Pursuant to the battery management system 10 of FIG. 1, microcontroller 17 and central processing unit (CPU) 19 each contribute processing capabilities for interpreting and executing instructions. Microcontroller 17 and CPU 19 each contain a processor, with the pair of processors cooperating to form a processing unit for system 10. Such an implementation enables charging of battery 14 even when computer 12 is turned off, as long as auxiliary power supply 16 is connected with microcontroller 17. By configuring microcontroller 17 to implement charging execution, battery 14 can be charged even when CPU 19 is turned off. Even though microcontroller 17 and CPU 19 are separately supplied with auxiliary operating power, they communicate together to carry out processing duties when implementing system 10. Furthermore, battery 14 supplies power to computer 12 via microcontroller 17. For purposes of simplification, the following description will refer to a single, common processor when describing the operation of system 10.

According to FIG. 1, battery 14 is coupled to a battery powered device, namely computer 12, for supplying operating power to the device. Battery management system 10 selectively connects battery 14 to computer 12 operatively between on and off positions, depending on the computer's operating requirements. Auxiliary power supply 16 is removably coupled with a connector to battery 12 via microcontroller 17 for supplying charging power to the battery, as well as for supplying an alternative source of operating power to the computer. Alternatively, supply 16 can be a large storage battery, or some other suitable DC or AC power source.

FIG. 2 illustrates a conceptual block diagram of the notebook computer 12 of FIG. 1 depicting layout of the battery management system 10. System 10 is implemented within computer 12 with a processor 22 (in this case, a CPU and a microcontroller) carried therein that implements a software-based control scheme stored in a memory 24. The resulting firmware-implemented control scheme and hardware forms a controller for directing operation of the battery management system 10. Display 20 of computer 12 forms part of a user interface 26 that enables a user to interact with the control scheme, including tailoring characteristics of the battery management system 10 and viewing measured battery capacity. A temperature sensor 28 and a timing clock 30 are coupled with processor 22 for monitoring thermal characteristics of battery 14 during selected charging and/or discharging points in time. A current sensing circuit 32 forms a detector that monitors current being discharged during a complete discharge cycle from battery 14, across resistor 34. One of a number of readily understood circuit implementations can be used to construct circuit 32. Circuit 32 provides a monitor configurable to measure battery capacity during the steady discharge cycle of the battery. Typically, resistor 34 comprises the internal operating resistance of computer 12, and battery 14 is discharged by enabling operation of all power consuming operating components of computer 12.

Processor 22 is carried by device 12, and is configured to operatively couple battery 14 and power supply 16 with device 12. Processor 22 is operative to selectively connect each of battery 14 and power supply 16 to device 12. Processor 22 is further configurable during coupling of the auxiliary power supply to completely discharge the battery via a steady discharge cycle. Even further, processor 22 communicates with chip 15 to exchange battery information. According to the construction of FIG. 1, the processor of microcontroller 17 selectively connects the battery and the auxiliary power supply, and retrieves battery information from chip 15.

B. Output Device

FIG. 3 depicts a Windows-based software user interface showing a "Battery Maintenance" screen display 38 illustrating one format for outputting measured battery capacity. Measured battery capacity (adjusted for battery temperature) is displayed as an icon in the form of a number representing the available percentage (%) of total battery capacity remaining. For purposes of identification by a user, the number is labelled as "Gas gauge (%):". The display of a battery status icon 40 on screen display 38 provides an output device for outputting the measured battery capacity. Alternatively, any of a number of visual, audible, or tactile output devices can be used to output measured battery capacity to a user.

FIG. 4 depicts a Windows-based software user interface showing a second "Battery Maintenance" screen display 42 illustrating another format for outputting measured battery capacity. Measured battery capacity in this display format is shown as an icon in the form of a horizontal bar graph 44 extending from 0% to 100% of total available battery capacity. For purposes of visual identification by a user, the 0% end is labelled as "E", for empty, and the 100% end is labelled as "F", for full.

C. Battery Management System

FIGS. 5–8 provide a logic flow diagram for the programming of the processor, or microcomputer/microcontroller of the notebook computer. FIG. 5 illustrates a deep cycle discharge process that is used to eliminate gas bubbles that cause the memory effect which reduces the available charge carrying capacity of the battery. Before describing the detailed implementation of the logic flow diagram, an overview of the battery charging system provided by the battery management system of this invention is detailed below.

The battery charging system has three charge rates, rapid charge, top-off charge, and maintenance (or trickle) charge. Rapid charge, top-off charge and maintenance charge are based upon a fractional amount of the manufacturer's rated capacity of the battery. For example, one preferred implementation for a six-cell NiCad battery sets the rapid charge at 1/1.9 of the manufacturer's rated capacity. Likewise, the top-off charge is set at one-eighth of the manufacturer's rated capacity. Furthermore, the maintenance charge is set at one-twentieth of the manufacturer's rated capacity. At the start of a charging cycle, the system will go into the rapid charge state. The battery voltage and temperature are monitored to determine when to discontinue rapid charge to avoid battery damage. Recognizing that this occurs at about 90% capacity, the system goes to the top-off charge rate. A full charge is not assumed to occur when rapid charge is discontinued. Rapid charge is discontinued and top-off charge begins if one of the following conditions is reached:

1. $\frac{\Delta V}{dt}$ becomes negative; e.g., a drop in battery voltage; or

2. $\frac{\Delta Temp}{dt}$ reaches a specified quantity and the battery temperature is below 45° C.

If the battery is being charged in a warmer climate, the battery temperature may rise to 45° C. If this occurs in the time range of 100–120 minutes, then the battery is assumed to be a good battery and the system goes to top-off charge for 90 minutes. Alternatively, if the battery reaches 45° C. in less than 100 minutes, then the battery charge is no good. For example, if the computer has been left in a warm environment, the battery will already be hot, and any attempt to charge the battery could lead to overheating and damage to the battery. Hence, the recalibration process is aborted until the temperature decreases. Details of the battery charging process are discussed in further detail below with reference to FIGS. 6 (first pass) and 8 (remaining passes).

After implementing a quantity of charge cycles, the system runs the battery through a "deep cycle discharge process" to eliminate gas bubbles that cause a memory effect and recalibrate the gas gauge. The "deep cycle discharge process" consists of discharging the battery until it is completely drained, charging the battery to full capacity, discharging the battery a second time until it is fully drained and then performing a final charge to full capacity. Details of this battery "deep cycle discharge process" are discussed in further detail below with reference to FIG. 5.

The purpose of performing the first complete discharge and first full capacity charge is to verify a full charge. After verifying a full charge, the capacity of the battery is monitored during the second deep discharge. Because current flow can not be measured directly, but is calculated from a voltage potential detected across a resistor and integrated over time, the measured current draw over a period of time is much more accurate if the draw is steady. Therefore, measuring current draw during a steady deep discharge is more accurate than measuring current draw while the machine is in use and drawing different quantities of current depending on which devices are operating. Details of this current draw measurement during a steady deep discharge, including a temperature adjustment feature, are discussed in further detail below with reference to FIG. 7.

According to the temperature adjustment feature, the measured capacity of the battery is also adjusted for temperature during the deep discharge. For each one second segment, the measured temperature is matched to a look-up table to determine a factor. The factor is multiplied by the measured current draw to determine a calculated current draw. The calculated current draw is used for measuring capacity. At the end of the deep discharge, the measured capacity (adjusted for temperature effects) is used for the "gas gauge" recalibration.

D. Logic Flow Diagram

According to FIG. 5, a "deep cycle discharge process" is disclosed as a first level logic flow diagram for the programming of the processor, or microcomputer of the notebook computer. The "deep cycle discharge process" is used to adjust the measured battery capacity for output to a user via an output device such as an icon-based "gas gauge". Additionally, the "deep cycle discharge process" eliminates gas bubbles that cause the memory effect which otherwise reduces the available charge carrying capacity of the battery.

The logic flow diagram of FIG. 5 is initiated in one of several ways. According to step number "S1", USER INTERVENTION can be used to initialize the start of a software-based program that implements the flowchart of FIGS. 5–8. For example, a keyboard key on the notebook computer can be assigned for a user to manually start the "deep cycle discharge process". Alternatively, a counter can be used to automatically initialize the cycle following operation of a designated number of in-use battery charge/ discharge cycles, or a designated number of user logins to the computer. Further alternatively, a timer can be used to automatically initialize, or trigger the "deep cycle discharge process" which causes the computer gas gauge to be recalibrated. After performing step "S1", the process proceeds to step "S2".

In step "S2", the logic flow diagram is initiated by the processor to START DEEP CYCLE, the "deep cycle discharge process" that eliminates gas bubbles which cause the undesirable memory effect in the battery. After initiating the "deep cycle discharge process", the process proceeds to step "S3".

In step "S3", the presence of EXTERNAL POWER SUPPLIED is detected by the processor. If external, or auxiliary power is supplied to the device, the process proceeds to step "S4". If not, the logic flow diagram implementation quits.

In step "S4", the processor initiates complete discharge of the battery. In one form, the processor configures the external power supply to an "off" position, and configures the battery to an "on" position. In another form, the processor configures the external power supply to an "off" position, and configures the battery to discharge across a resistor to ground (see resistor 34 of FIG. 2). After performing step "S4", the process proceeds to step "S5".

In step "S5", the processor directs the charging of the battery to full capacity with the external power supply. Step "S5" involves the above-mentioned three different charge rates. The particulars of step "S5" actually involve a series of steps, which will be described in greater detail with reference to FIG. 6. After performing step "S5" (the routine of FIG. 6), the process proceeds to step "S6".

In step "S6", the processor directs the complete discharge of the battery. The particulars of step "S6" actually involve a series of steps, which will be described in greater detail with reference to FIG. 7. After performing step "S6" (the routine of FIG. 7), the process proceeds to step "S7".

In step "S7", the presence of CHARGE BATTERY STATUS GOOD is detected by the processor. If it is determined that the battery charge status is good (according to the flowchart implementation of FIG. 6), the process proceeds to step "S8". If not, the logic flow diagram implementation proceeds to step "S9".

In step "S8", the processor reprograms the memory to assign a new adjusted measured capacity to the battery. After performing step "S8", the process proceeds to step "S9,".

In step "S9", the processor directs the charging of the battery to full capacity with the external power supply. Step "S9" involves the above-mentioned three different charge rates, similar to step "S5" (and FIG. 6). However, step "S9" eliminates the steps associated with determining whether the battery charge status is good or bad; namely, steps "S16" and "S17" (of FIG. 6). The particulars of step "S9" actually involve a series of steps, which will be described in greater detail with reference to FIG. 8. After performing step "S9" (the sub-routine of FIG. 8), the process is complete.

Figure 6:
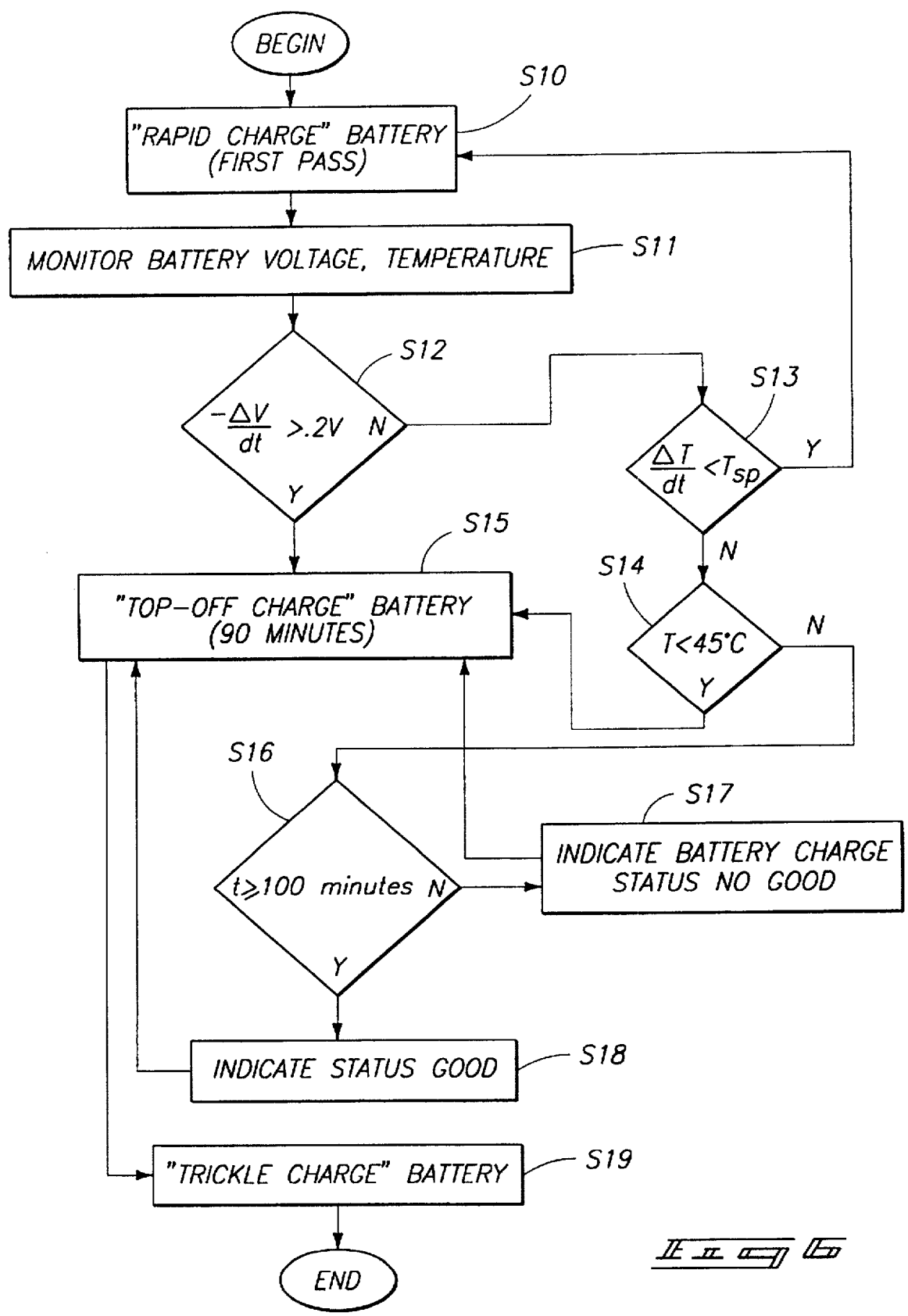
FIG. 6 is a flowchart illustrating in further detail the sequence of steps employed in rapid charging the battery during the first pass rapid charge of FIG. 5.

According to FIG. 6, the particulars of implementing step "S5" (of FIG. 5) are initiated with step "S10". Namely, the first pass charging of the battery is initiated with a "RAPID CHARGE" BATTERY step. Here, a fast, or rapid charge is applied to the battery by the external power supply, via direction from the processor. After performing step "S10", the process proceeds to step "S11".

In step "S11", the battery voltage and temperature are monitored in order to facilitate the characterizing of the status and condition of the battery, according to subsequent steps. A voltage sensor is used to detect the battery voltage via the processor. Likewise, a temperature sensor, such as temperature sensor 28 (of FIG. 2), is used to detect the battery temperature. After performing step "S11", the process proceeds to step "S12".

In step "S12", the presence of a differential decrease in voltage over a differential period of time that exceeds a minimum threshold value of 0.2 volts is calculated and detected by the processor. If it is determined that the negative value exceeds the threshold value, the process proceeds to step "S15". If not, the process proceeds to step "S13".

In step "S13", the presence of a differential increase in temperature over a differential period of time that drops below a threshold value, $T_{sp}$, of specified quantity is calculated and detected by the processor. If it is determined that the resulting value is not less than the threshold value, the process proceeds to step "S10". If it is determined that the resulting value is less than the threshold value, the process proceeds to step "S14".

In step "S14", the presence of a battery temperature below a 45° C. threshold value is detected by the processor. If it is determined that the resulting value is below the threshold value, the process proceeds to step "S15". If it is determined that the resulting value is not below the threshold value, the process proceeds to step "S16".

In step "S15", a TOP-OFF CHARGE is performed on the battery via direction from the processor. According to this implementation, the top-off charge is performed for a period of 90 minutes by way of the external power supply. After performing step "S15", the process proceeds to step "S19".

In step "S16", heating of the battery during charging is detected to determine whether the battery reaches a temperature of 45° C. in less that 100 minutes. If it is determined that the battery reaches this temperature during charging in less than 100 minutes, the process proceeds to step "S17". If it is determined that the battery temperature is reached only after at least 100 minutes (if at all) have elapsed, the process proceeds to step "S18".

In step "S17", for the case where the battery reaches a temperature of 45° C. in less than 100 minutes, a determination is made by the processor that the battery charge status is no good. Such result is then stored in memory for subsequent retrieval, writing to the battery memory chip, and/or output to a user via a display, audible device, or tactile feature. The process then proceeds to step "S15" for top-off charging of the battery.

In step "S18", a determination is made by the processor that the battery charge status is good. Such result is then stored in memory for subsequent retrieval, writing to the battery memory chip, and/or output to a user via a display, audible device, or tactile feature. The process then proceeds to step "S15" for top-off charging of the battery.

In step "S19", the processor directs the maintenance charging of the battery by the external power supply, until it is disconnected. After performing step "S19" (the sub-routine of FIG. 6), the process is complete.

Figure 7:
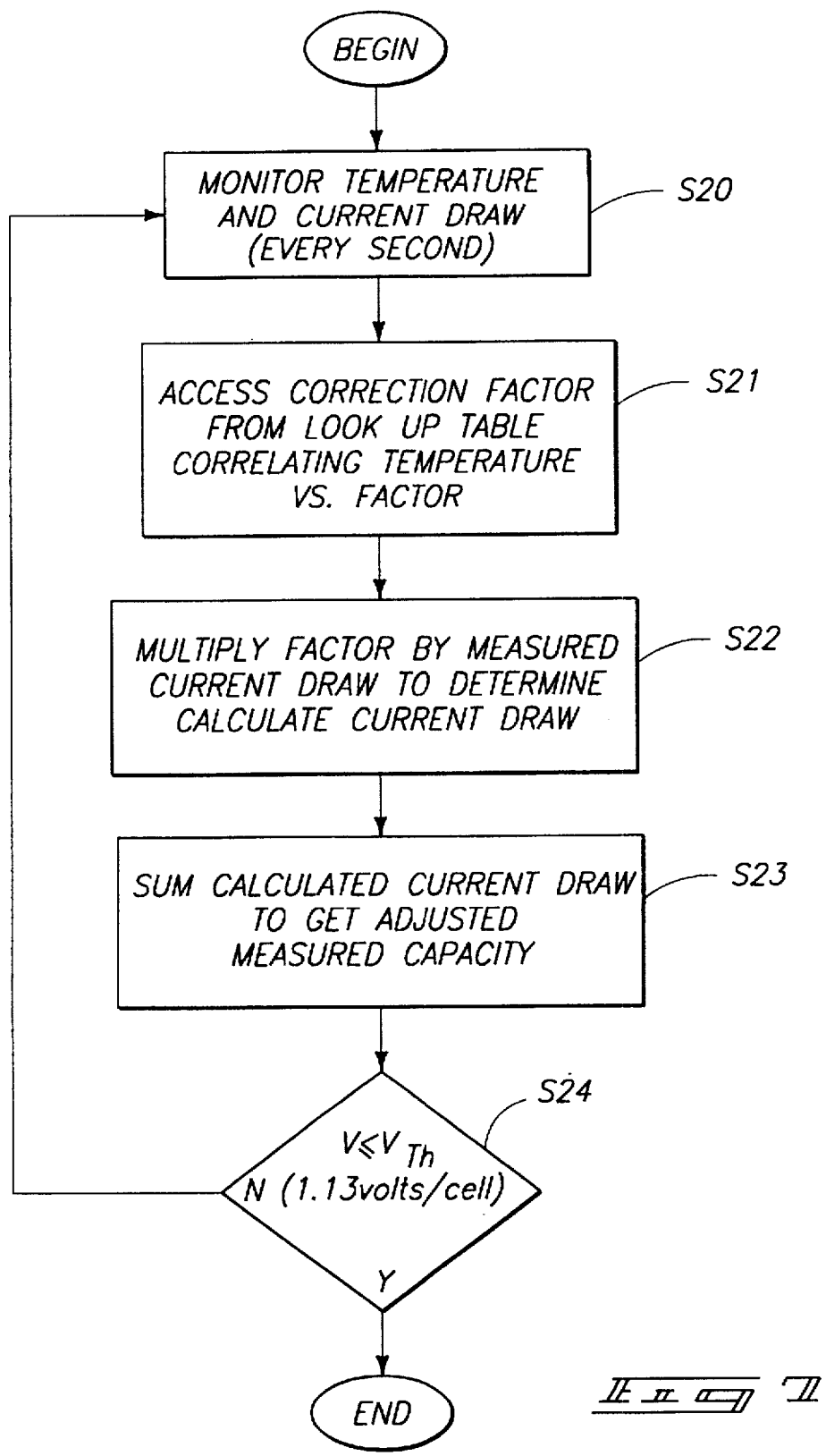
FIG. 7 is a flowchart illustrating in further detail the sequence of steps employed in detecting adjusted measured battery capacity for the battery during the second complete discharge of FIG. 5.

According to FIG. 7, step "S20" initiates a sub-routine for if realizing step "S6" (of FIG. 5) via the processor. Namely, battery charge capacity is monitored during this second deep discharge cycle (of step "S6"). Battery temperature is monitored via temperature sensor 28 (of FIG. 2) under direction of the processor. During a steady deep discharge, current draw is measured across a resistor 34 via current sensing circuit 32 (of FIG. 2) under direction of the processor. Preferably, battery temperature and current draw are monitored every second. After performing step "S20", the process proceeds to step "S21".

In step "S21", the processor accesses a pre-stored correction factor lookup table that is stored in memory. The lookup table stores correlated values for battery temperature along with associated correction factors for correcting the measured current draw from each one second interval. After performing step "S21", the process proceeds to step "S22".

In step "S22", the processor multiplies the accessed correction factor (for a measured battery temperature) with the associated measured current draw value. In this manner, a calculated current draw is determined for each measured one second interval. After performing step "S22", the process proceeds to step "S23".

In step "S23", the processor directs the integration over time (or summing) of each one second calculated current draw value to obtain an adjusted (for temperature) measured capacity for the battery. After performing step "S23", the process proceeds to step "S24".

In step "S24", the processor directs the comparison of a detected voltage for the battery with a threshold voltage value, $V_{Th}$. If it is determined that the battery voltage on average is less than or equal to 1.13 volts/cell (6.8 volts for six cells in series), operation of the sub-routine terminates. If it is determined that the detected battery voltage on average is greater than 1.13 volts/cell, the process proceeds to step "S20".

According to FIG. 8, step "S25" initiates a sub-routine for implementing step "S9" (of FIG. 5) in response to initiation from the processor. Namely, the second pass charging of the battery (of FIG. 5) is initiated with a "RAPID CHARGE" BATTERY step. Here, a fast, or rapid charge is applied to the battery by the external power supply, via direction from the processor. After performing step "S25", the process proceeds to step "S26".

In step "S26", the battery voltage and temperature are monitored in order to facilitate characterization of the status and condition of the battery, according to subsequent steps. A voltage sensor is used to detect the battery voltage via the processor. Likewise, a temperature sensor, such as temperature sensor 28 (of FIG. 2), is used to detect the battery temperature. After performing step "S26", the process proceeds to step "S27".

In step "S27", the presence of a differential decrease in voltage over a differential period of time that exceeds a minimum threshold value of 0.2 volts is calculated and detected by the processor. If it is determined that the negative value exceeds the threshold value, the process proceeds to step "S30". If not, the process proceeds to step "S28".

In step "S28", the presence of a differential increase in temperature over a differential period of time that drops below a threshold value, $T_{sp}$, of specified quantity is calculated and detected by the processor. If it is determined that the resulting value is not less than the threshold value, the process proceeds to step "S30". If it is determined that the resulting value is less than the threshold value, the process proceeds to step "S29".

In step "S29", the presence of a battery temperature below a 45° C. threshold value is detected by the processor. If it is determined that the resulting value is below the threshold value, the process proceeds to step "S25". If it is determined that the resulting value is not below the threshold value, the process proceeds to step "S30".

In step "S30", a TOP-OFF CHARGE is performed on the battery via direction from the processor. According to this implementation, the top-off charge is performed for a period of 90 minutes by way of the external power supply. After performing step "S30", the process proceeds to step "S31".

In step "S31", the processor directs the maintenance charging of the battery by the external power supply, until it is disconnected. After performing step "S31" (the end of the sub-routine of FIG. 8), the process is complete, and a one-cycle implementation of the logic flow chart of FIG. 5 is completed.

E. Battery Charge States

The battery management system currently supports two types of batteries, NiCAD and NiMH. Regardless of the type of battery used in the system, the battery charging will be in one of seven states:

1. Off/Idle: This is the default state when the system is rebooted. This state remains until the external, or auxiliary power is detected.

2. Deep discharge: The battery pack is discharged by turning off the charge current and disabling the external power source. When the discharge is completed, the charging system automatically re-enables the external power source and switches to the preset charge mode (fast or slow charge). For purposes of FIG. 9, "Fast" charge is analogous to "Rapid" charge as used in FIGS. 1–8. Four bytes in the battery memory have been allocated for the timestamp of this event. The CPU can log the deep cycle discharge event in these locations.

3. Stopped: The charging system is completely disabled. The external power will not re-enable the charge control. Swapping batteries or selecting another charging state will terminate the stopped state.

4. Slow charge: The battery is charged at low charge rate which is defined in the battery pack for 5 seconds, idled for 10 milli-seconds; then discharged for 50 milli-seconds, and idled for another 50 milli-seconds. This charging cycle repeats until the slow charge timer (defined in the battery pack; default: 14 hours) is expired. The charging system switches automatically to a maintenance charge state as the charge is completed.

5. Maintenance charge: The charge cycle will be the same as for the slow charge but with a lower charge rate which is defined in the battery pack via the chip 15 (of FIG. 1). The charging system remains in this state until the external power is removed, the battery is swapped, or another charging state is selected.

6. Fast charge: The charge cycle will be the same as for the slow charge but at a higher charge rate which is defined in the battery pack. This charging rate repeats until the $\Delta V$ or $\Delta T$ is detected. A slow charge rate will be continued to the battery as the top off charge for a definite time (defined in the battery pack; default: 1 hour for NiCAD 1.5 hours for NiMH) is expired. The charging system switches automatically to the maintenance charge state as the top off charge is terminated.

7. Battery voltage check: The battery voltage is either too low (short) or too high (open). There is no charge current to the battery in this state. When the battery voltage is too high, it can be either open or full charge; if the battery voltage reaches close to 10 volts, the battery is considered open; and the charge system will switch to maintenance charge. If the battery voltage drops to the normal range, the battery is considered full; a top off charge will be applied to this charged battery. The charge control is stopped if the battery is shorted.

FIG. 9 illustrates a charge control state diagram showing the various charge states and their transitions. Fast (or rapid) charge, slow (or top-off) charge, and maintenance (or trickle) charge correspond to the rapid, top-off and maintenance charge states, respectively, of FIGS. 1–8. The following transition table shows the actions and events that occurred between the states depicted in FIG. 9. The charging states: fast charge, slow charge, maintenance charge, deep discharge, and stop charge, are selectable by the application via a BIOS interface, and are implemented via the processor and memory. The constant values shown in Table 1 below are the default values; some of these values may be different from the charge algorithm stored in the battery memory:

TABLE 1

| Actions | Events |
| --- | --- |
| Discharge Complete | Battery voltage ($V_{batt}$) < 6.8 volts OR |
|  | Low battery (LB) = 1 |
| Fast Charge Complete | Battery temperature ($T_{batt}$) < 0° C. [too cold] |
|  | OR |
|  | $T_{batt}$ > 45° C. [too hot] OR |

TABLE 1-continued

| Actions | Events |
|---|---|
| | $T_{batt}$ $T_0$ + 5° C. in the 1st 10 minutes OR $V_{batt}$ < maximum $V_{batt}$ − 0.2 V (not for NiMH) OR $T_{batt1}$ − $T_{batt0}$ > 4° C. (Batt.temp.changed in 5 min) 1 hour top off charge timer expires |
| Slow Charge Complete | $T_{batt}$ < 0° C. [too cold] OR $T_{batt}$ > 45° C. [too hot] 14 hour charge timer expires |
| External Power Droop | External Power ($V_{exp}$) < 10 V for 15 seconds |
| External Power Present | $V_{exp}$ > = 7.5 V for 5 seconds |
| Lose External Power | $V_{exp}$ < 7.5 V for 2 minutes |
| Bad External Power | $V_{exp}$ > 13 V |
| Battery Open/Short | $V_{batt}$ < 5.1 V [short] OR $V_{batt}$ > 9.5 V [open] |
| Battery shorted | Charge disabled |
| Battery Swapped | Charge state changes to idle |

All of the above-listed charge modes are controlled by two signals: CHGC and /DISCHG. In addition, system hardware has also provided two input signals to the processor for monitoring external power (ACPWR) and current flow direction (IDIR); four A/D channels are allocated for monitoring the battery voltage, current, ambient temperature and the external power voltage. For example, the battery temperature is read from the battery ID chip. By varying the duty cycles of CHGC signal, a desired charge current can be produced to the charging system of the battery management system.

In use, the charge control algorithm is loaded from the battery memory on power up or when the battery is installed. The charge algorithm will be loaded into memory where it will remain and be used in the charging process until the CPU, or processor updates this information. Typically, this will occur each time a new battery is loaded into the device. The controller will stop the charge process if the battery type is unrecognized.

The battery charging control of the battery management system normally executes in one-second intervals, as was discussed above according to FIG. 7. The fast, slow, and maintenance charge states will be varied from 10 milliseconds to one-second intervals depending on the sub-states. The charge cycle will be aborted; and the charge system will switch to idle state if the external power is lost for 2 minutes or the battery is removed.

F. Gas Gauge Process

The gas gauge process is executed once every 10 milliseconds, providing a corresponding sampling rate. The battery capacity information is sent to the CPU once every 30 seconds. Every battery pack is equipped with a battery identification chip (see chip 15, of FIG. 1). This chip is pre-programmed with battery type, the charge algorithm and the maximum capacity of the battery in the nonvolatile memory of the chip. This chip also provides 32 bytes of memory to store information. The processor will save the gas gauge information in this memory area every time the battery sends it to the CPU or before normal suspend. Note that the initial gas gauge (IGG) value is varied depending on the following conditions:

1. Power up with invalid gas gauge in battery memory. With external power detected, the IGG resets to 0%. Without external power, the IGG resets to 100%.

2. Power up valid gas gauge in battery memory. The IGG is restored from the battery memory except when:

The delta suspend time >0: the IGG=(Δsuspend time*power consumption on suspend)

The maximum capacity varies depending on the type of battery being used. Because the sampling rate is in 10 milli-second or one centi-second intervals, the maximum capacity is converted into mACenti-seconds during the gas gauge process. If the NiCad has a maximum capacity of 1600 mAH, it would be 576,000,000 (1600*3600*100) mACenti-seconds. If the NiMH's maximum capacity is 2400 mAH, it would be 864,000,000 mACenti-seconds.

Since the battery capacity changes on ambient temperature, the gas gauge will be temperature compensated. As was discussed according to FIGS. 2 and 7, a temperature sensor is used to monitor battery temperature. The temperature compensated data will be provided by hardware engineering in the form of a lookup table stored in memory, according to that disclosed in FIG. 7.

The battery charge acceptance rate depends on battery temperature, the aging of the battery, the environment that the battery is being used in and some other factors such as the frequency of deep cycle discharge, etc. In addition, current battery manufacturers have not established any reliable information for the charge acceptance rate to the battery users. Through development efforts, applicants have established fairly accurate gas gauge compensation tables for specific charge and discharge situations. Furthermore, the gas gauge compensation factor on discharge is also stored in the battery packs for the finer adjustment of the gas gauge. When the batteries are stored, or shelved too long, they will self discharge; and the gas gauge will no longer accurately reflect their actual capacities. Two limits of battery condition, low battery voltage and fully charged, allow the processor to re-adjust the gas gauge relatively close to its actual condition. Note that, as a practical matter it is alright to view the gas gauge as the actual capacity of a battery. However, the gas gauge is really a convenient way to show the relative battery condition.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

We claim:

1. A gas gauging system, comprising:
   a battery powered device;
   a battery selectively connected to the device for supplying operating power to the device;
   an auxiliary power supply configured to connect with the battery for supplying charging power to the battery;
   a detector configurable to measure battery capacity;
   a processor carried by the device, operatively connected with the detector, and configured to operatively enable the battery and the power supply, respectively, for powering the device, the processor being further configurable during connection of the auxiliary power supply to remove memory effects, then subsequently recalibrate the gas gauging system by completely discharging the battery from a fully charged state to a fully discharged state via a discharge cycle while concurrently measuring battery capacity via the detector; and
   an output device for outputting a value based upon the measured battery capacity, the value indicative of battery capacity for the recalibrated gas gauging system.

2. The gas gauge system of claim 1 wherein the discharge cycle of the battery comprises a substantially steady discharge cycle.

3. The gas gauge system of claim 1 wherein the processor, prior to measuring the battery capacity during the discharge cycle, causes the battery to be completely discharged, then completely charged.

4. The gas gauge system of claim 1 wherein the processor, subsequent to measuring the battery capacity, causes the battery to be completely charged.

5. The gas gauge system of claim 1 further comprising:

a temperature sensor configured to detect battery temperature during the discharge cycle;

a timer configured to time the battery discharge cycle; and a lookup table for storing a temperature correction factor for each measured temperature, the correction factor being multiplied by a measured current draw at each time to obtain a calculated current draw corresponding to such time.

6. The gas gauge system of claim 5 wherein the calculated current draw at each time is integrated to obtain a temperature adjusted measured capacity for the battery.

7. The gas gauge system of claim 1 further comprising a memory, the processor and the memory cooperating to provide a controller for implementing the measurement of the battery capacity.

8. The gas gauge system of claim 1 wherein the detector comprises a current sensing circuit configured to detect current discharge during the discharge cycle of the battery from the fully charged state to the fully discharged state.

9. The gas gauge system of claim 1 wherein the output device comprises a gas gauge.

10. The gas gauge system of claim 1 wherein the output device comprises a battery status icon.

11. The gas gauge system of claim 1 wherein the battery powered device is a notebook computer.

12. The gas gauging system of claim 1 wherein the auxiliary power supply is removably connected to the battery.

13. A gas gauging system, comprising:

a battery powered device;

a battery selectively connected to the device for supplying operating power to the device;

an auxiliary power supply configured to connect with the battery for supplying charging power to the battery;

a detector configurable to measure battery capacity;

a processor carried by the device and configured to operatively enable the battery and the power supply, respectively, for powering the device, the processor being further configurable during connection of the auxiliary power supply to remove memory effects and recalibrate the gas gauging system by sequentially completely discharging the battery a first time, and completely charging the battery a first time, completely discharging the battery a second time while enabling the detector to measure battery capacity during the complete discharge of the battery the second time; and an output device for outputting a calibrated value based upon the measured battery capacity.

14. The gas gauging system of claim 13 wherein the battery powered device is a notebook computer.

15. The gas gauging system of claim 13 wherein the processor implements discharge of the battery comprising a substantially steady discharge cycle.

16. A gas gauging management system, comprising:

a battery powered device;

a battery selectively connected to the device for supplying operating power to the device;

an auxiliary power supply configured for connection with the battery for supplying charging power to the battery;

a controller provided by the device and configured to enable the battery and the power supply, respectively, for supplying power to the device, the controller being further configurable during connection of the auxiliary power supply to remove battery memory effects and subsequently completely discharge the battery from a fully charged battery state to a fully discharged battery state via a deep cycle discharge; and a detector configurable to measure battery capacity during the deep cycle discharge of the battery.

17. The system of claim 16 wherein the deep cycle discharge of the battery comprises a substantially steady discharge cycle.

18. The system of claim 16 wherein the controller comprises a processor and a memory, the processor and the memory in operation being caused to implement a software-based control scheme to realize an adjusted measured capacity for the battery as a consequence of fully discharging the battery.

19. The system of claim 16 further comprising a temperature sensor configured to detect battery temperature while completely discharging the battery and measuring battery capacity during the deep cycle discharge of the battery.

20. The system of claim 16 further comprising an output device for outputting a value based upon the measured battery capacity.

21. The system of claim 20 wherein the battery powered device comprises a notebook computer, and the output device comprises a gas gauge.

22. The system of claim 16 wherein the detector comprises a current sensing circuit configured to detect current discharge during the deep cycle discharge of the battery from the fully charged state to the fully discharged state.

23. A method of monitoring battery discharge of a battery powered device, comprising:

providing a battery powered device having a battery and an auxiliary power supply;

providing the auxiliary power supply connected with the battery;

removing battery memory effects by completely draining the battery;

completely charging the battery with the auxiliary power supply until fully charged;

completely discharging the fully charged battery via a discharge cycle until fully drained;

measuring the battery capacity during the discharge cycle of the battery; and outputting a value based upon the measured battery capacity for detection by a user of the device.

24. The method of claim 23 wherein the resulting battery discharge cycle is a steady discharge cycle comprising a substantially steady current flow that is detected as a voltage potential across a resistor.

25. The method of claim 23 further comprising the step of thermally adjusting the measured battery capacity for temperature variations of the battery occurring during the battery discharge cycle that otherwise cause errors in the measured battery capacity.

26. The method of claim 23 wherein the step of outputting the measured battery capacity further comprises displaying the measured battery capacity as a battery status icon.

27. The method of claim 26 wherein the icon is displayed as a battery gas gauge.

28. The method of claim 23 further comprising the steps of:

prior to completely charging the battery, completely discharging the battery;

the step of completely discharging the battery being followed by completely charging the battery so as to verify a full charge being applied to the battery such that, when measuring the battery capacity during the following step of completely discharging the battery a second time, a fully charged battery is being monitored during discharge.

29. The method of claim 28 further comprising the step of:

following measuring the battery capacity, completely charging the battery a second time.

30. The method of claim 23 wherein the auxiliary power supply is removably connected with the auxiliary power supply.

* * * * *

UNITED STATES PATENT AND TRADEMARK OFFICE
CERTIFICATE OF CORRECTION

PATENT NO. : 5,751,134
DATED : May 12, 1998
INVENTOR(S) : Brian Hoerner, Kam Quan, and Frank Smith It is certified that error appears in the above-identified patent and that said Letters Patent is hereby corrected as shown below:

Col. 8, line 41: delete "if" at beginning of line.

Col. 10, line 12: delete "low" and insert --a slow--.

Col. 11, line 43: after "to" and before "idle", insert --the--.

Col. 11, line 64: delete ">0:" and insert --> 0--.

Col. 11, line 65: delete "time*power" and insert --time * power--.

Signed and Sealed this

First Day of September, 1998

Attest:

BRUCE LEHMAN

Attesting Officer

Commissioner of Patents and Trademarks